(12) United States Patent
Nishiyama et al.

(10) Patent No.: US 11,104,615 B2
(45) Date of Patent: Aug. 31, 2021

(54) OXIDE SINTERED BODY AND SPUTTERING TARGET

(71) Applicant: KOBELCO RESEARCH INSTITUTE, INC., Kobe (JP)

(72) Inventors: Kohei Nishiyama, Hyogo (JP); Yuki Tao, Hyogo (JP)

(73) Assignee: KOBELCO RESEARCH INSTITUTE, INC., Kobe (JP)

( * ) Notice: Subject to any disclaimer, the term of this patent is extended or adjusted under 35 U.S.C. 154(b) by 105 days.

(21) Appl. No.: 16/614,403

(22) PCT Filed: Apr. 17, 2018

(86) PCT No.: PCT/JP2018/015923
§ 371 (c)(1),
(2) Date: Nov. 18, 2019

(87) PCT Pub. No.: WO2018/211900
PCT Pub. Date: Nov. 22, 2018

(65) Prior Publication Data
US 2020/0181027 A1    Jun. 11, 2020

(30) Foreign Application Priority Data

May 19, 2017  (JP) .............................. JP2017-099949
Jan. 10, 2018  (JP) .............................. JP2018-002052

(51) Int. Cl.
*H01B 1/08*  (2006.01)
*C04B 35/453*  (2006.01)
*C23C 14/34*  (2006.01)

(52) U.S. Cl.
CPC ........ *C04B 35/453* (2013.01); *C23C 14/3414* (2013.01); *H01B 1/08* (2013.01);
(Continued)

(58) Field of Classification Search
CPC . H01B 1/00; H01B 1/08; C23C 14/086; H01J 37/3429; C04B 35/453; C04B 35/457
See application file for complete search history.

(56) References Cited

U.S. PATENT DOCUMENTS 8,858,844 B2 * 10/2014 Yano ...................... C04B 35/453
                                                                252/519.5
9,905,403 B2 *  2/2018 Tao ....................... C23C 14/3414
(Continued)

FOREIGN PATENT DOCUMENTS

JP        5522869        6/2014
JP      2015214429    * 12/2015
(Continued)

OTHER PUBLICATIONS

International Search Report dated Jun. 12, 2018 in PCT/JP2018/015923 filed on Apr. 17, 2018.

*Primary Examiner* — Mark Kopec
(74) *Attorney, Agent, or Firm* — Oblon, McClelland, Maier & Neustadt, L.L.P.

(57) ABSTRACT

An oxide sintered body having metal elements composed of In, Ga, Zn and Sn and containing a hexagonal layered compound represented by $InGaO_3(ZnO)_m$ (m is an integer of 1 to 6). When ratios (atomic %) of contents of In, Zn and Sn to all metal elements excluding oxygen contained in the oxide sintered body are taken as [In], [Zn] and [Sn], respectively, the relations [Zn]≥40 atomic %, [In]≤15 atomic %, [Sn]≤4 atomic % are satisfied.

6 Claims, 2 Drawing Sheets

(52) U.S. Cl.
    CPC ............... *C04B 2235/3284* (2013.01); *C04B 2235/3286* (2013.01); *C04B 2235/3293* (2013.01)

(56) References Cited

U.S. PATENT DOCUMENTS

| | | | |
|---|---|---|---|
| 10,090,136 B2* | 10/2018 | Tao | ............ C04B 35/457 |
| 10,196,733 B2* | 2/2019 | Nishimura | ........... C23C 14/3414 |
| 10,515,787 B2* | 12/2019 | Tao | ............ C23C 14/086 |
| 2009/0308635 A1 | 12/2009 | Yano et al. | |
| 2011/0168994 A1 | 7/2011 | Kawashima et al. | |
| 2011/0260118 A1 | 10/2011 | Yano et al. | |
| 2013/0285053 A1 | 10/2013 | Kawashima et al. | |

FOREIGN PATENT DOCUMENTS

| | | |
|---|---|---|
| KR | 10-2011-0020901 A | 3/2011 |
| WO | WO 00/67571 A1 | 11/2000 |
| WO | WO 2007/037191 A1 | 5/2007 |

\* cited by examiner

OXIDE SINTERED BODY AND SPUTTERING TARGET

TECHNICAL FIELD

The present invention relates to an oxide sintered body and a sputtering target, which are used when an oxide semiconductor thin film of a thin-film transistor (TFT) for use in a display device such as liquid crystal display and organic EL display is deposited by a sputtering method.

BACKGROUND ART

An amorphous (non crystalline) oxide semiconductor for use in TFT has a high carrier mobility and a large optical band gap and can be deposited at a low temperature, compared with general-purpose amorphous silicon (a-Si). Therefore, its application to a next-generation display requiring large size, high resolution and high-speed drive and to a resin substrate having low heat resistance is expected. As a composition of the oxide semiconductor suitable for these applications, an In-containing amorphous oxide semiconductor has been proposed and, for example, a product using an In—Ga—Zn-based oxide (IGZO) semiconductor is put into practical use. In addition, for the purpose of imparting different properties such as high mobility, an Sn-containing oxide semiconductor such as In—Ga—Zn—Sn-based oxide semiconductor and In—Ga—Sn-based oxide semiconductor is attracting attention.

In forming the above-described oxide semiconductor thin film, a sputtering method of subjecting a sputtering target (hereinafter sometimes referred to as "target material") of the same material as the thin film to sputtering is suitably used. The sputtering target is used in a state of an oxide sintered body being bonded to a backing plate, but the oxide sintered body is sometimes cracked in the process of bonding the oxide sintered body to the backing plate.

In the Sn-containing oxide semiconductor above, a crystal phase derived from Sn may be generated, but there is disclosed a technique for obtaining a good semiconductor film by controlling the crystal phase and thereby suppressing cracking of a sputtering target or suppressing abnormal electrical discharge during sputtering. For example, Patent Literatures 1 and 2 disclose an In—Zn—Sn-based oxide semiconductor containing a hexagonal layered compound represented by $In_2O_3(ZnO)_m$ (m is an integer of 3 to 9) and a spinel structure compound represented by $Zn_2SnO_4$.

In addition, Patent Literature 3 discloses a technique where in the case of an In—Ga—Zn—Sn-based oxide sintered body having added thereto Zn, in order to prevent a compound represented by $InGaO_3(ZnO)_m$ (m is an integer of 1 to 20) as a main component of the IGZO-based oxide from abnormally growing to bring about abnormal electrical discharge and in turn causing a defect in the obtained film, the contents of In, Ga, Zn and Sn are adjusted, and any of $Ga_2In_6Sn_2O_{16}$, $Ga_{2.4}In_{5.6}Sn_2O_{16}$ and $(Ga,In)_2O_3$ is used as the main component.

CITATION LIST

Patent Literature

Patent Literature 1: International Publication No. 2000/067571
Patent Literature 2: International Publication No. 2007/037191
Patent Literature 3: Japanese Patent No. 5,522,889

SUMMARY OF INVENTION

Technical Problem

Meanwhile, in order to enhance the wet etching property (the solubility of an oxide semiconductor thin film to an etching solution for oxide semiconductor processing, such as oxalic acid) in an oxide semiconductor thin film of TFT using an In—Ga—Zn—Sn-based oxide sintered body, a large amount of Zn needs to be added. However, a system in which a large amount of Zn is added has a problem that the above-described compound represented by $InGaO_3(ZnO)_m$ is likely to abnormally grow and due to coarsening of the grain size of the compound, the oxide sintered body is, in particular, readily cracked in the process of bonding the obtained oxide sintered body to a backing plate.

The present invention has been made under these circumstances, and an object thereof is to provide an oxide sintered body capable of suppressing occurrence of cracking at the time of bonding even in an In—Ga—Zn—Sn-based oxide sintered body in which a large amount of Zn is added, and a sputtering target using the oxide sintered body.

Solution to Problem

As a result of many intensive studies, the present inventors have found that when an oxide sintered body used for a sputtering target has a specific composition and crystal phases, the object above can be attained, and have accomplished the present invention.

That is, the present invention includes the following [1].

[1] An oxide sintered body having metal elements composed of In, Ga, Zn and Sn and containing a hexagonal layered compound represented by $InGaO_3(ZnO)_m$ (m is an integer of 1 to 6),
wherein when ratios (atomic %) of contents of In, Zn and Sn to all metal elements excluding oxygen contained in the oxide sintered body are taken as [In], [Zn] and [Sn], respectively, the following expressions (1) to (3) are satisfied:

$$[Zn] \leq 40 \text{ atomic \%} \quad (1)$$

$$[In] \leq 15 \text{ atomic \%} \quad (2)$$

$$[Sn] \leq 4 \text{ atomic \%} \quad (3)$$

In addition, preferred embodiments of the present invention include the following [2] to [6].

[2] The oxide sintered body according to [1] above, wherein $InGaO_3(ZnO)_m$ includes hexagonal layered compounds represented by $InGaO_3(ZnO)_3$ and $InGaZn_2O_5$.

[3] The oxide sintered body according to [2] above, wherein when the oxide sintered body is subjected to X-ray diffraction, the $InGaO_3(ZnO)_3$ and $InGaZn_2O_5$ satisfy the following expression (4):

$$[InGaO_3(ZnO)_3] + [InGaZn_2O_5] \geq 0.9 \quad (4),$$

wherein $[InGaO_3(ZnO)_3] = I(InGaO_3(ZnO)_3)/(I(InGaO_3(ZnO)_3) + I(InGaZn_2O_5) + I(Ga_2In_6Sn_2O_{16}) + I$ $(Ga_3InSn_5O_{16})+I(Zn_2SnO_4))$ and $[InGaZn_2O_5]=I(InGaZn_2O_5)/(I(InGaO_3(ZnO)_3)+I(InGaZn_2O_5)+I(Ga_2In_6Sn_2O_{16})+I(Ga_3InSn_5O_{16})+I(Zn_2SnO_4));$ in the expression, $I(InGaO_3(ZnO)_3)$, $I(InGaZn_2O_5)$, $I(Ga_2In_6Sn_2O_{16})$, $I(Ga_3InSn_5O_{16})$ and $I(Zn_2SnO_4)$ are respectively diffraction peak intensities of $InGaO_3(ZnO)_3$ phase, $InGaZn_2O_5$ phase, $Ga_2In_6Sn_2O_{16}$ phase, $Ga_3InSn_5O_{16}$ phase and $Zn_2SnO_4$ phase identified by X-ray diffraction.

[4] The oxide sintered body according to any one of [1] to [3] above, wherein the average grain size of the oxide sintered body is 10 μm or less.

[5] The oxide sintered body according to [4] above, wherein an average grain size is 6 μm or less.

[6] A sputtering target obtained by using the oxide sintered body according to any one of [1] to [5] above, which has a resistivity of 1 Ω·cm or less.

Advantageous Effects of Invention

According to the present invention, an oxide sintered body capable of suppressing occurrence of cracking at the time of bonding even in an In—Ga—Zn—Sn-based oxide sintered body in which a large amount of Zn is added, and a sputtering target using the oxide sintered body can be provided.

DESCRIPTION OF EMBODIMENTS

Figure 1:
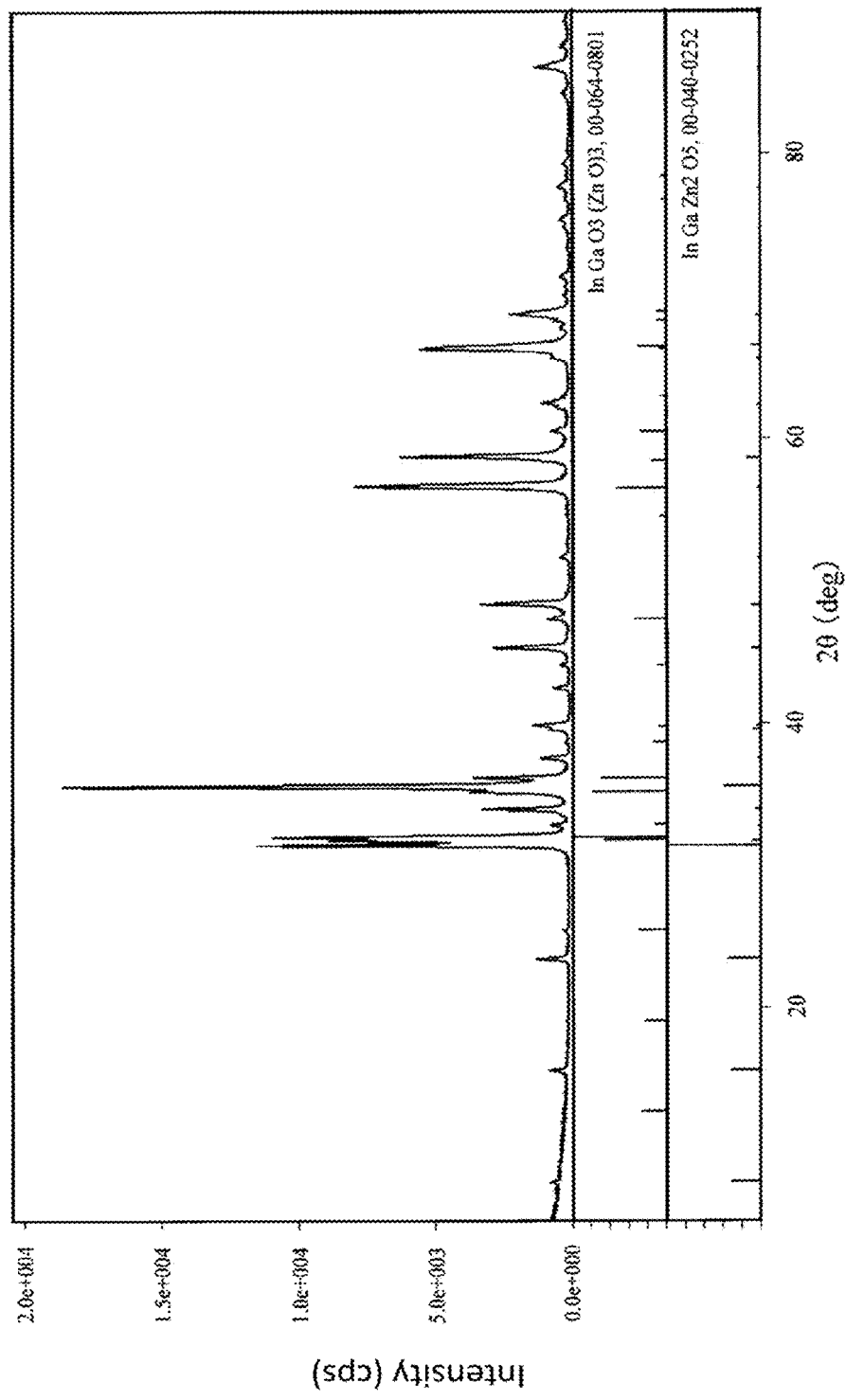
FIG. 1 is a graph (X-ray diffraction chart) illustrating the X-ray diffraction results of the oxide sintered body of the present invention in Example 2.

The present inventors have made intensive studies on an oxide sintered body so as to provide an oxide sintered body for sputtering targets, which enables stable deposition over a long period of time by the suppression of abnormal electrical discharge during sputtering and cracking of a sputtering target material and moreover, is suitable for depositing an oxide semiconductor film capable of enhancing wet etching property.

As a result, it has been found that in an oxide sintered body having metal elements composed of In, Ga, Zn and Sn, when each of the contents of respective metal elements contained in the oxide sintered body is appropriately controlled, an oxide sintered body composed of predetermined crystal phases can be obtained and cracking of the oxide sintered body can be suppressed while ensuring excellent wet etching property.

Specifically, it has been found out that (a) when a large amount (40 atomic % or more) of Zn is added, excellent wet etching property can be ensured; and (b) when not more than a predetermined amount (15 atomic % or less) of In is added and not more than a predetermined amount (4 atomic % or less) of Sn is added, fine crystal phases composed of a compound of $InGaO_3(ZnO)_m$ (m is an integer of 1 to 6) in which Sn is uniformly solid-dissolved are formed while suppressing generation of Sn-derived crystal phases such as $Ga_2In_6Sn_2O_{16}$, $Ga_3InSn_5O_{16}$ and $Zn_2SnO_4$ and a structure resistant to bonding cracking is obtained. The present invention has been accomplished based on this finding.

First, the oxide sintered body according to the present invention is described in detail.

The oxide sintered body of the present invention has metal elements composed of In, Ga, Zn and Sn and contains a hexagonal layered compound represented by $InGaO_3(ZnO)_m$ (m is an integer of 1 to 6), wherein when ratios (atomic %) of contents of In, Zn and Sn to all metal elements excluding oxygen contained in the oxide sintered body are taken as [In], [Zn] and [Sn], respectively, the following expressions (1) to (3) are satisfied:

[Zn]≥40 atomic % (1)

[In]≤15 atomic % (2)

[Sn]≤4 atomic % (3)

Here, in order to form an oxide sintered body having excellent wet etching property and capable of suppressing cracking of the oxide sintered body in the bonding process, each of the contents of respective metal elements contained in the oxide sintered body needs to be appropriately controlled.

Specifically, when the ratios (atomic %) of the contents of In, Zn and Sn to all metal elements excluding oxygen contained in the oxide sintered body are taken as [In], [Zn] and [Sn], respectively, the ratios are controlled to satisfy the following expressions (1) to (3):

[Zn]≥40 atomic % (1)

[In]≤15 atomic % (2)

[Sn]≤4 atomic % (3)

Expression (1) defines the Zn ratio ([Zn]=Zn/(In+Ga+Zn+Sn)) in all metal elements. Zn has a function of enhancing amorphization of the oxide semiconductor thin film.

If [Zn] is too low, the effect of enhancing the wet etching property is hardly obtained. Accordingly, [Zn] is 40 atomic % or more, preferably 45 atomic % or more, more preferably 50 atomic % or more, still more preferably 55 atomic % or more.

In addition, if [Zn] is too high, it is likely that the content of In relatively decreases, causing a reduction in the field-effect mobility, or the content of Ga relatively decreases, causing a reduction in the electrical stability of the oxide semiconductor thin film. Accordingly, [Zn] is preferably 65 atomic % or less, more preferably 60 atomic % or less.

Expression (2) defines the In ratio ([In]=In/(In+Ga+Zn+Sn)) in all metal elements. In general, In is an element contributing to enhancement of the electrical conductivity.

If [In] is too high, formation of a crystal phase having a bixbyite structure, such as $In_2O_3$, or an Sn-containing crystal phase such as $Ga_2In_6Sn_2O_{16}$, tends to be induced. As a result, cracks develop starting from such a crystal phase and can give rise to a cause of cracking at the time of bonding. Accordingly, [In] is 15 atomic % or less, preferably 12 atomic % or less, more preferably 10 atomic % or less.

In addition, if [In] is too low, the field-effect mobility may decrease. Accordingly, [In] is 1 atomic % or more, preferably 3 atomic % or more, more preferably 7 atomic % or more.

Expression (3) defines the Sn ratio ([Sn]=Sn/(In+Ga+Zn+Sn)) in all metal elements. In general, Sn has a function of enhancing the chemical resistance of the oxide semiconductor thin film, such as wet etching property.

If [Sn] is too high, generation of Sn-derived crystal phases (a crystal phase such as $Ga_2In_6Sn_2O_{16}$, $Ga_3InSn_5O_{16}$ or $Zn_2SnO_4$) cannot be suppressed. As a result, cracks develop starting from the crystal phase generated and can give rise to a cause of cracking at the time of bonding. Accordingly, [Sn] is 4 atomic % or less, preferably 3.5 atomic % or less, more preferably 3 atomic % or less.

In addition, if [Sn] is too low, although details are described later, a state of Sn being uniformly solid-dissolved in the compound of $InGaO_3(ZnO)_m$ (m is an integer of 1 to 6) contained in the oxide sintered body according to the present invention is not created, and the effect of suppressing growth of the crystal phase by the pinning effect of the solid-dissolved Sn is hardly obtained. Accordingly, [Sn] is 1 atomic % or more, preferably 1.5 atomic % or more, more preferably 2 atomic % or more.

Next, the hexagonal layered compounds represented by $InGaO_3(ZnO)_m$ (m is an integer of 1 to 6) detected when the oxide sintered body according to the present invention is subjected to X-ray diffraction are described. More specifically, the hexagonal layered compounds are hexagonal layered compounds represented by $InGaO_3(ZnO)_3$ and $InGaZn_2O_5$.

Each of $InGaO_3(ZnO)_3$ and $InGaZn_2O_5$ is an oxide formed by bonding of In, Ga and Zn and O constituting the oxide sintered body of the present invention. Unlike the above-described crystal phase such as $Ga_2In_6Sn_2O_{16}$, $Ga_3InSn_5O_{16}$ or $Zn_2SnO_4$, Sn contained in the oxide sintered body does not constitute the skeleton of a crystal structure but is uniformly solid-dissolved in the crystal phase of $InGaO_3(ZnO)_3$ or $InGaZn_2O_5$.

Whether Sn is uniformly solid-dissolved in the crystal phase above can be confirmed by the X-ray diffraction results and in-plane composition mapping using EPMA (Electron Probe X-ray Micro Analyzer, electron probe microanalysis).

As described above, when Sn is uniformly solid-dissolved in these crystal phases, the solid-dissolved Sn can fulfill the so-called pinning role against coarsening of each crystal phase. Accordingly, if Sn itself constitutes the skeleton of a crystal phase as in $Ga_2In_6Sn_2O_{16}$, $Ga_3InSn_5O_{16}$ or $Zn_2SnO_4$, this is disadvantageous in that the pinning effect cannot be effectively produced. In order for Sn not to constitute the skeleton of a crystal phase and to be uniformly solid-dissolved in the crystal phase, as described above, it is important to add not more than a predetermined amount of Sn.

By virtue of the pinning effect due to Sn, the average grain size of the hexagonal layered compounds such as $InGaO_3(ZnO)_3$ and $InGaZn_2O_5$ can be kept small, and the effect of suppressing cracking at the time of bonding can be enhanced.

Furthermore, in order to more enhance the effect of preventing cracking at the time of bonding, it is preferable to refine the average grain size of grains of the oxide sintered body. Specifically, the average grain size of grains observed with a scanning electron microscope (SEM) in a fracture surface (an arbitrary position on a section surface when the oxide sintered body is cut at an arbitrary position in the thickness direction) of the oxide sintered body is controlled to preferably 10 µm or less, and cracking of the oxide sintered body can thereby be more prevented.

The average grain size of grains of the oxide sintered body is more preferably 8 µm or less, still more preferably 6 µm or less, yet still more preferably 5 µm or less. On the other hand, the lower limit value of the average grain size is not particularly limited, but in view of the balance between refining of the average grain size and production cost, the lower limit of the average grain size is preferably about 0.05 µm.

Furthermore, in the present invention, it is preferable to appropriately control the grain size distribution as well as the average grain size of grains of the oxide sintered body. Specifically, coarse grains having a grain size exceeding 15 µm give rise to cracking of the oxide sintered body at the time of bonding and therefore, the proportion thereof is preferably as small as possible. Accordingly, the area ratio of coarse grains having a grain size exceeding 15 µm in the entire grains is preferably 10% or less, more preferably 8% or less, still more preferably 6% or less, yet still more preferably 4% or less.

The relative density of the oxide sintered body of the present invention is preferably 90% or more. By increasing the relative density of the oxide sintered body, the effect of preventing cracking at the time of bonding can be more enhanced. The relative density of the oxide sintered body of the present invention is more preferably 95% or more, still more preferably 98% or more. The upper limit value is not particularly limited and may be, for example, 100%, but in view of production cost, the upper limit is preferably 99%.

In order to further enhance the effect of suppressing cracking at the time of bonding, it is preferred that the diffraction peak intensities of $InGaO_3(ZnO)_3$ phase and $InGaZn_2O_5$ phase identified by X-ray diffraction satisfy the following expression (4):

$$[InGaO_3(ZnO)_3]+[InGaZn_2O_5] \geq 0.9 \quad (4)$$

wherein $[InGaO_3(ZnO)_3]=I(InGaO_3(ZnO)_3)/(I(InGaO_3(ZnO)_3)+I(InGaZn_2O_5)+I(Ga_2In_6Sn_2O_{16})+I(Ga_3InSn_5O_{16})+I(Zn_2SnO_4))$ and $[InGaZn_2O_5]=I(InGaZn_2O_5)/(I(InGaO_3(ZnO)_3)+I(InGaZn_2O_5)+I(Ga_2In_6Sn_2O_{16})+I(Ga_3InSn_5O_{16})+I(Zn_2SnO_4))$.

In the expression, $I(InGaO_3(ZnO)_3)$, $I(InGaZn_2O_5)$, $I(Ga_2In_6Sn_2O_{16})$, $I(Ga_3InSn_5O_{16})$ and $I(Zn_2SnO_4)$ are respectively diffraction peak intensities of $InGaO_3(ZnO)_3$ phase, $InGaZn_2O_5$ phase, $Ga_2In_6Sn_2O_{16}$ phase, $Ga_3InSn_5O_{16}$ phase and $Zn_2SnO_4$ phase identified by X-ray diffraction. Incidentally, "I" means that it is the measured value of X-ray diffraction intensity (diffraction peak intensity).

With respect to diffraction peaks obtained by subjecting the oxide sintered body to X-ray diffraction, the compound phases of $InGaO_3(ZnO)_3$ and $InGaZn_2O_5$ have crystal structures described in ICSD (Inorganic Crystal Structure Database) cards 00-064-0801 and 00-040-0252, respectively (corresponding to $InGaO_3(ZnO)_3$ phase and $InGaZn_2O_5$ phase, respectively) (see Table 2).

In the present invention, when the oxide sintered body is subjected to X-ray diffraction, it is preferred that the total of $InGaO_3(ZnO)_3$ phase and $InGaZn_2O_5$ phase is contained in a predetermined ratio.

When the diffraction peak intensity ratios of $InGaO_3(ZnO)_3$ phase and $InGaZn_2O_5$ phase are decreased, this means that in the entire oxide sintered body, the proportion of $InGaO_3(ZnO)_3$ phase and $InGaZn_2O_5$ phase contributing to the suppression of coarsening of grains by virtue of pinning effect of Sn decreases and consequently, the proportion of precipitated crystal phases (e.g., $Ga_2In_6Sn_2O_{16}$, $Ga_3InSn_5O_{16}$, $Zn_2SnO_4$) other than these compounds increases.

In this case, cracks develop starting from crystal phases other than $InGaO_3(ZnO)_3$ phase and $InGaZn_2O_5$ phase, which are locally precipitated, and may give rise to a cause of cracking at the time of bonding. For this reason, $[InGaO_3(ZnO)_3]+[InGaZn_2O_5]$ is preferably 0.9 or more, more preferably 0.95 or more, still more preferably 0.99 or more.

A suitable production method for the oxide sintered body of the present invention is described below.

The oxide sintered body of the present invention is obtained by mixing and sintering indium oxide; gallium oxide; zinc oxide; and tin oxide, and the sputtering target can be produced by processing the oxide sintered body. Specifically, the sputtering target can be obtained by subjecting oxide powders to (a) mixing/pulverization→(b) drying/granulation→(c) preforming→(d) degreasing→(e) atmospheric sintering, and subjecting the obtained oxide sintered body to (f) processing→(g) bonding.

Of these steps, in the present invention, as described in detail below, it may be sufficient if the selection conditions of indium oxide, gallium oxide, zinc oxide and tin oxide as raw material powders and the conditions of atmospheric sintering ((e)) are appropriately controlled. Other steps are not particularly limited, and usually employed steps may be appropriately selected. In the following, each step is described, but the present invention is by no means limited thereto.

First, an indium oxide powder; a gallium oxide powder; a zinc oxide powder; and a tin oxide powder are blended in a predetermined ratio, followed by mixing and pulverization. Each of the raw material powders used preferably has a purity of about 99.99% or more because an impurity element, if present in a trace amount, may impair semiconducting properties of the oxide semiconductor thin film. The blending ratio of respective raw material powders is preferably controlled such that the ratios of contents of indium, gallium, zinc and tin to all metal elements excluding oxygen contained in the oxide sintered body fall within the ranges above.

The (a) mixing/pulverization is preferably performed using a ball mill by charging the raw material powders thereinto together with water. As the ball or bead used in this step, a ball or bead formed of, for example, materials such as nylon, alumina and zirconia is preferably used. On this occasion, a dispersant for the purpose of homogeneous mixing, and a binder for ensuring ease of the subsequent forming step, may be mixed.

Next, a mixed powder obtained in the step above is preferably subjected to the (b) drying/granulation by means of, for example, a spray drier.

After drying/granulation, the (c) preforming is performed. In performing the forming, the powder after drying/granulation fills a die having a predetermined dimension and is preformed by die pressing. The preforming is performed for the purpose of enhancing the handling property at the time of setting in a sintering furnace and therefore, is sufficient if a compact is formed by applying a pressure of approximately from 0.5 to 1.0 tonf/cm$^2$.

Thereafter, forming (main forming) is performed by CIP (Cold Isostatic Pressing). For increasing the relative density of the oxide sintered body, the pressure during forming is preferably controlled to about 1 tonf/cm$^2$ or more.

In the case where a dispersant or a binder is added to the mixed powder, it is preferable to perform the (d) degreasing by heating the compact so as to remove the dispersant or binder. The heating conditions are not particularly limited as long as the purpose of degreasing can be achieved, but, for example, the compact may be kept in the air generally at about 500° C. for about 5 hours.

After degreasing, the compact is set in a die providing a desired shape and sintered by (e) atmospheric sintering.

In the present invention, sintering is performed at a sintering temperature: from 1,300 to 1,600° C., for a holding time at this temperature: from 1 to 50 hours. In addition, it is preferable to once hold the compact at 1,100 to 1,300° C. for 1 to 10 hours. By selecting these temperature ranges and holding times, compound phases satisfying expressions (1) to (3) can be obtained.

If the sintering temperature is low, the compact cannot be sufficiently densified, and the material strength decreases. On the other hand, if the sintering temperature is too high, the grain is coarsened, making it impossible to control the average grain size of grains to a predetermined range, and the material strength decreases. Accordingly, a sintering temperature is 1,300° C. or more, preferably 1,350° C. or more, more preferably 1,400° C. or more, and 1,600° C. or less, preferably 1,550° C. or less.

In the present invention, the average temperature rise rate up to the sintering temperature above after forming is preferably 100° C./hr or less. If the average temperature rise rate exceeds 100° C./hr, abnormal growth of grain is likely to occur, and the relative density cannot be sufficiently increased.

In the sintering step, the sintering atmosphere is preferably set to an oxygen gas atmosphere (for example, air atmosphere) or an oxygen gas pressurized atmosphere. The pressure of the atmosphere gas is preferably set to an atmospheric pressure so as to suppress evaporation of zinc oxide having a high vapor pressure.

After an oxide sintered body is obtained as above, (f) processing (g) bonding are performed in a conventional manner, as a result, the sputtering target of the present invention is obtained. The processing method for the oxide sintered body is not particularly limited, and the oxide sintered body may be processed into a shape according to various uses by a known method.

The sputtering target can be obtained by bonding the processed oxide sintered body to a backing plate by use of a bonding material. The type of the material of the backing plate is not particularly limited, but pure copper or copper alloy having excellent thermal conductivity is preferred. The type of the bonding material is also not particularly limited, and various known bonding materials having electrical conductivity can be used. Examples thereof include an In-based solder material and an Sn-based solder material.

The bonding method is also not particularly limited and may be, for example, a method in which the oxide sintered body and the backing plate are melted by heating at a temperature causing melting of the bonding material, for example, at approximately from 140 to 220° C., the molten bonding material is applied to the bonding surface of the backing plate, respective bonding surfaces are stuck together, and both are pressure-bonded and then cooled.

In the sputtering target obtained using the oxide sintered body of the present invention, cracking due to a stress, etc. developed by shock, heat history, etc. during the bonding operation does not occur. The resistivity is also very good and is preferably 1 Ω·cm or less, more preferably $10^{-1}$ Ω·cm or less, still more preferably $10^{-2}$ Ω·cm or less.

When the sputtering target of the present invention is used, deposition in which the abnormal electrical discharge during sputtering and the cracking of the sputtering target material are more suppressed can be achieved, and physical vapor deposition (sputtering method) using the sputtering target can be efficiently performed in the production line of a display device. In addition, the oxide semiconductor thin film obtained also exhibits good TFT properties.

EXAMPLES

The present invention is more specifically described below by referring to Examples and Comparative Examples, but the present invention is not limited to the following Examples and can also be implemented by making changes within the range conformable to the gist, and all of these changes are encompassed by the technical scope of the present invention.
(Preparation of Sputtering Target)

An indium oxide powder ($In_2O_3$) having a purity of 99.99%, a zinc oxide powder (ZnO) having a purity of 99.99%, a gallium oxide powder ($Ga_2O_3$) having a purity of 99.99% and a tin oxide powder ($SnO_2$) having a purity of 99.99% were blended at a ratio shown in Table 1, and water and a dispersant (ammonium polycarboxylate) were added thereto, followed by mixing in a zirconia ball mill for 24 hours. Then, the mixed powder obtained in the step above was dried and granulated.

The thus-obtained powder was preformed by die pressing (forming pressure: 1.0 tonf/cm$^2$, size of compact: ϕ110×t 13 mm, t is the thickness) and then subjected to main forming at a forming pressure of 3.0 tonf/cm$^2$ by CIP (cold isostatic pressing).

The compact obtained in this way was allowed to rise in temperature to 500° C. at normal pressure in an air atmosphere and held at that temperature for 5 hours to effect degreasing. The compact after degreasing was set in a sintering furnace and sintered.

The resulting sintered body was machined to a finished dimension of ϕ100×t5 mm and bonded to a Cu-made backing plate to prepare a sputtering target.
(Average Grain Size)

With respect to each of Examples and Comparative Examples, the "Average Grain Size (μm)" in Table 1 was measured as follows.

First, the oxide sintered body was broken down, and its fracture surface (an arbitrary position on a section surface when the oxide sintered body was cut at an arbitrary position in the thickness direction) was mirror-polished to prepare a sample. Next, a photograph of the structure thereof was taken at a magnification of 400 times by using a scanning electron microscope (SEM); a straight line having a length of 100 μm was drawn in an arbitrary direction; the number (N) of grains included within the straight line was determined; and the value calculated from [100/N] was taken as "grain size on straight line". Similarly, 20 straight lines were drawn at such intervals as keeping coarse grains from overlapping with each other (at intervals of at least 20 μm or more), and the grain sizes on individual straight lines were calculated. Then, the value calculated from [the sum of grain sizes on individual straight lines/20] was taken as "average grain size of oxide sintered body".
(Cracking at the Time of Bonding)

With respect to each of Examples and Comparative Examples, the presence or absence of "Cracking at the Time of Bonding" in Table 1 was measured as follows.

First, the sintered body was processed into a shape of 4 inches in diameter and 5 mm in thickness and bonded to a backing plate to obtain a sputtering target. At this time, the sintered body and backing plate were allowed to rise in temperature on a hot plate up to 180° C. over 20 minutes, and the bonding operation was performed using a wetting material (In metal). After the bonding operation, whether or not cracking occurred on the oxide sintered body surface was confirmed with an eye. When a crack exceeding 1 mm was observed on the oxide sintered body surface, "cracking" was judged to be present. The bonding operation was performed 10 times, and when cracking occurred even only once, the sample was evaluated as failed and indicated by "present" in Table 1. On the other hand, when cracking did not occur even once out of 10 times, the sample was evaluated as passed and indicated by "none" in Table 1.
(Peak Intensity Ratios of $InGaO_3(ZnO)_3$ Phase and $InGaZn_2O_5$ Phase)

With respect to each of Examples and Comparative Examples, the "Peak Intensity Ratios of $InGaO_3(ZnO)_3$ Phase and $InGaZn_2O_5$ Phase" in Table 1 were measured as follows.

First, the sputtering target obtained by sputtering was removed from the backing plate, and a test piece of 10 mm square was cut out therefrom and subjected to the following X-ray diffraction to determine the X-ray diffraction pattern of each oxide sintered body. Analyzer: "X-ray Diffractometer RINT-TTR-III" manufactured by Rigaku Corporation Analysis Conditions:

Target: Cu

Monochromatization: Use of monochromator (Kα)

Target output: 40 kV-200 mA (Continuous Measurement) θ/2θ Scanning

Slits: Divergence: 1/2°, Scattering: 1/2°, Receiving: 0.15 mm

Monochromator receiving slit: 0.6 mm

Scanning speed: 2°/min

Sampling interval: 0.02°

Measurement angle (2θ): 5 to 90°

As an example, FIG. 1 shows a graph (X-ray diffraction chart) illustrating X-ray diffraction results for the oxide sintered body of Example 2. From the thus-obtained X-ray diffraction chart of each oxide sintered body, respective compound phases (crystal phases) were identified based on the above-described ICSD cards and measured for the diffraction peak intensity (height of diffraction peak) shown in Table 2.

As for the peak, among the compound phases, a peak having a high diffraction peak intensity and having as little overlapping with the peaks of other compound phases as possible was selected. The measured values of the peak height at a designated peak in individual compound phases are denoted respectively by $I(InGaO_3(ZnO)_3)$, $I(InGaZn_2O_5)$, $I(Ga_2In_6Sn_2O_{16})$, $I(Ga_3InSn_5O_{16})$ and $I(Zn_2SnO_4)$ (wherein "I" means that it is the measured value of X-ray diffraction intensity (diffraction peak intensity)), and the total of the peak intensity ratio of $InGaO_3(ZnO)_3$ phase and the peak intensity ratio of $InGaZn_2O_5$ phase, i.e., $[InGaO_3(ZnO)_3]+[InGaZn_2O_5]$, was determined according to the following expressions.

$$[InGaO_3(ZnO)_3]=I(InGaO_3(ZnO)_3)/(I(InGaO_3(ZnO)_3)+I(InGaZn_2O_5)+I(Ga_2In_6Sn_2O_{16})+I(Ga_3InSn_5O_{16})+I(Zn_2SnO_4))$$

$$[InGaZn_2O_5]=I(InGaZn_2O_5)/(I(InGaO_3(ZnO)_3)+I(InGaZn_2O_5)+I(Ga_2In_6Sn_2O_{16})+I(Ga_3InSn_5O_{16})+I(Zn_2SnO_4))$$

Peaks of compound phases other than those described above were hardly observed.

In this Example, when the thus-obtained $[InGaO_3(ZnO)_3]+[InGaZn_2O_5]$ was 0.9 or more, the sample was evaluated as passed.

(Confirmation that Sn is Uniformly Solid-Dissolved)

With respect to each of Examples, in order to confirm that Sn was uniformly solid-dissolved in the crystal phase of $InGaO_3(ZnO)_3$ or $InGaZn_2O_5$, the oxide sintered bodies of Examples 1 to 6 were subjected to element mapping of the Sn distribution by means of EPMA. The measurement conditions of EPMA are as follows:

Analyzer: "JXA-8900RL" manufactured by JEOL Ltd.

Analysis Conditions:

Accelerating voltage: 15.0 kV

Irradiation current: $1.998 \times 10^{-8}$ Å

Beam diameter: minimum (0 μm)

Measurement time: 100.00 ms

Number of measurement points: 250×250

Measurement interval: X 0.40 μm, Y 0.40 μm

Measurement area: 400 μm×400 μm

Number of measurement visual fields: 1 visual field

Figure 2:
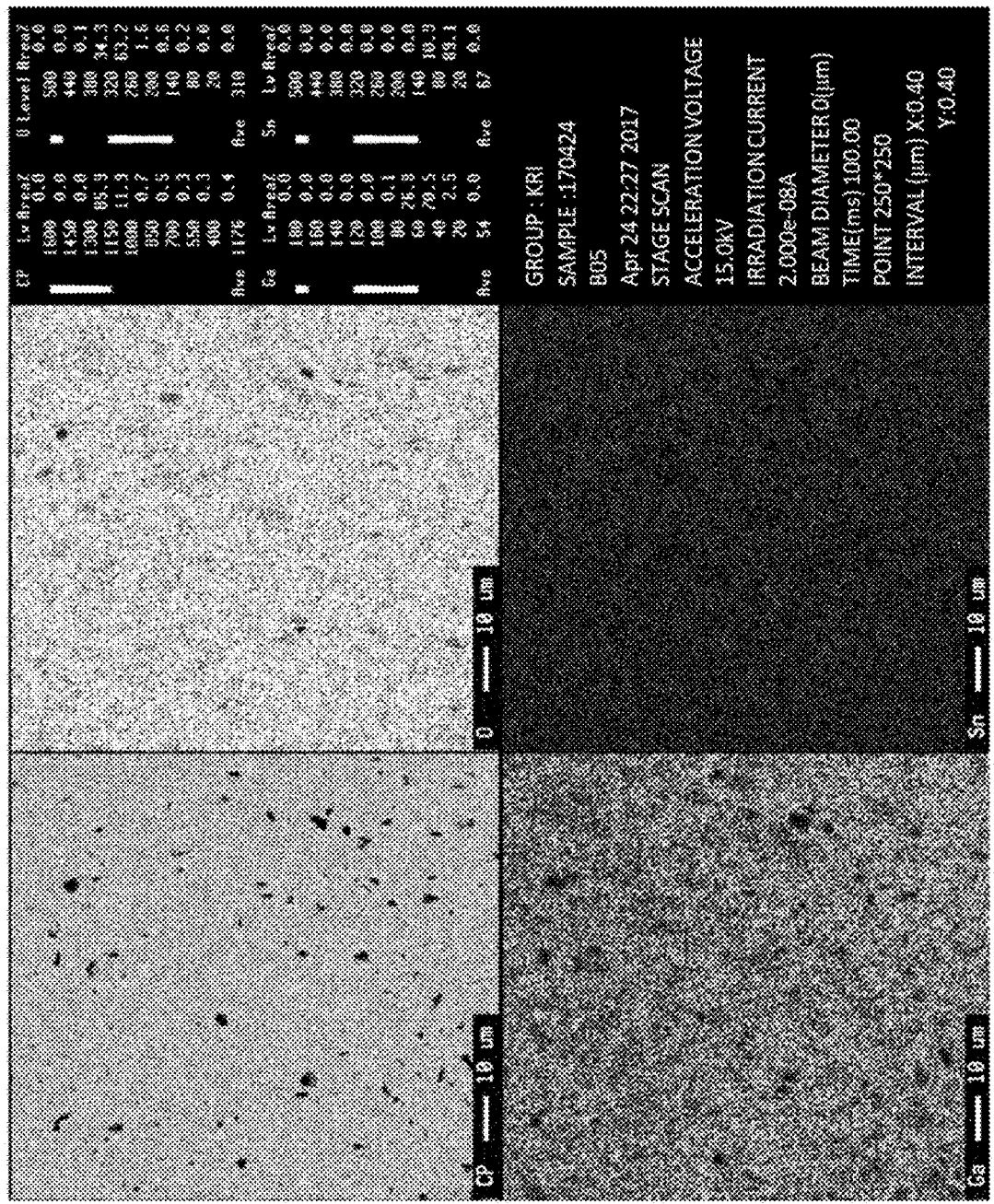
FIG. 2 is a diagram illustrating EPMA test results (element mapping) of the oxide sintered body of the present invention in Example 2.

As an example, FIG. 2 illustrates the results of element mapping for the oxide sintered body of Example 2. First, a color scale is depicted in right side of FIG. 2, and "CP" in the top-left photograph of FIG. 2 means a reflected electron image. In addition, the oxide sintered body contains Zn and In as elements other than O (oxygen), Ga and Sn illustrated in FIG. 2, but element mapping photographs thereof are omitted. Furthermore, in FIG. 2, assuming Level of Sn at a point exhibiting a maximum Sn concentration is 500 and Level of Sn at a point not containing Sn is 20, the Sn concentration at each point is expressed by a relative value to the maximum concentration, i.e., Level: 500. And, the abundance ratio of each Level is denoted by the area ratio (Area %).

Referring to the results of Sn in FIG. 2, the area ratio of Level: 140 or less is 100.0% (10.9+89.1=100.0%) in total, and it is seen that Sn is uniformly solid-dissolved in the crystal phase without causing segregation.

It could be confirmed that similarly to the results of Example 2, the area ratio of Level: 140 or less is 90% or more in total also in Examples other than Example 2. These could verify that the oxide sintered body according to the present invention constitutes crystal phases of $InGaO_3(ZnO)_3$ and $InGaZn_2O_5$ as revealed by the X-ray diffraction results above and Sn is uniformly solid-dissolved in the crystal phase of $InGaO_3(ZnO)_3$ or $InGaZn_2O_5$ as revealed by the EPMA results above.

TABLE 1

| | Composition of Oxide Sintered Body (atomic %) | | | | Average Grain Size (μm) | Cracking at the Time of Bonding | Peak Intensity Ratios of $InGaO_3(ZnO)_3$ and $InGaZn_2O_5$ |
|---|---|---|---|---|---|---|---|
| | [In] | [Ga] | [Zn] | [Sn] | | | |
| Example 1 | 9.1 | 30.4 | 58.2 | 2.3 | 7 | none | 0.994 |
| Example 2 | 11.3 | 29.6 | 56.3 | 2.8 | 5 | none | 0.993 |
| Example 3 | 14.0 | 26.7 | 56.3 | 3.0 | 5 | none | 0.995 |
| Example 4 | 12.3 | 28.3 | 56.2 | 3.2 | 8 | none | 0.991 |
| Example 5 | 13.6 | 33.1 | 49.8 | 3.5 | 7 | none | 0.973 |
| Example 6 | 10.2 | 29.6 | 56.4 | 3.8 | 9 | none | 0.974 |
| Comparative Example 1 | 16.7 | 38.7 | 40.2 | 4.4 | 15 | present | 0.752 |
| Comparative Example 2 | 17.5 | 35.2 | 42.7 | 4.6 | 19 | present | 0.701 |

TABLE 2

| Crystal Phase | Reference ICSD Card No. | Index of Peak Measured (h k l) |
|---|---|---|
| $InGaO_3(ZnO)_3$ | 00-064-0801 | (0 1 8) |
| $InGaZn_2O_5$ | 00-040-0252 | (1 0 4) |
| $Ga_2In_6Sn_2O_{16}$ | 01-089-7011 | (3 1 2) |
| $Ga_3InSn_5O_{16}$ | 00-051-0214 | (-6 0 1) |
| $Zn_2SnO_4$ | 01-074-2184 | (1 1 1) |

While the invention has been described in detail and with reference to specific embodiments thereof, it will be apparent to one skilled in the art that various changes and modifications can be made therein without departing from the spirit and scope of the invention. This application is based on Japanese Patent Application (Patent Application No. 2017-099949) filed on May 19, 2017 and Patent Application (Patent Application No. 2018-002052) filed on Jan. 10, 2018, the entirety of which is incorporated herein by way of reference.

The invention claimed is:

1. An oxide sintered body, comprising metal elements composed of In, Ga, Zn and Sn and comprising a hexagonal layered compound represented by $InGaO_3(ZnO)_m$, wherein m is an integer of 1 to 6, and when ratios (atomic %) of contents of In, Zn and Sn to all metal elements excluding oxygen comprised in the oxide sintered body are taken as [In], [Zn] and [Sn], respectively, the following expressions (1) to (3) are satisfied:

$$[Zn] \leq 40 \text{ atomic \%} \qquad (1)$$

$$[In] \leq 15 \text{ atomic \%} \qquad (2)$$

$$[Sn] \leq 4 \text{ atomic \%} \qquad (3).$$

2. The oxide sintered body of claim 1, wherein $InGaO_3(ZnO)_m$ comprises hexagonal layered compounds represented by $InGaO_3(ZnO)_3$ and $InGaZn_2O_5$.

3. The oxide sintered body of claim 2, wherein when the oxide sintered body is subjected to X-ray diffraction, the $InGaO_3(ZnO)_3$ and $InGaZn_2O_5$ satisfy the following expression (4):

$$[InGaO_3(ZnO)_3]+[InGaZn_2O_5] \geq 0.9 \qquad (4)$$

wherein $[InGaO_3(ZnO)_3]=I(InGaO_3(ZnO)_3)/(I(InGaO_3(ZnO)_3)+I(InGaZn_2O_5)+I(Ga_2In_6Sn_2O_{16})+I(Ga_3InSn_5O_{16})+I(Zn_2SnO_4))$ and $[InGaZn_2O_5]=I(InGaZn_2O_5)/(I(InGaO_3(ZnO)_3)+I(InGaZn_2O_5)+I(Ga_2In_6Sn_2O_{16})+I(Ga_3InSn_5O_{16})+I(Zn_2SnO_4))$, wherein $I(InGaO_3(ZnO)_3)$, $I(InGaZn_2O_5)$, $I(Ga_2In_6Sn_2O_{16})$, $I(Ga_3InSn_5O_{16})$ and $I(Zn_2SnO_4)$ are respectively diffraction peak intensities of an $InGaO_3(ZnO)_3$ phase, an $InGaZn_2O_5$ phase, a $Ga_2In_6Sn_2O_{16}$ phase, a $Ga_3InSn_5O_{16}$ phase and a $Zn_2SnO_4$ phase identified by X-ray diffraction.

4. The oxide sintered body of claim 1, wherein an average grain size of the oxide sintered body is 10 μm or less.

5. The oxide sintered body of claim 4, wherein the average grain size is 6 μm or less.

6. A sputtering target obtained by using the oxide sintered body of claim 1, wherein the sputtering target has a resistivity of 1 Ω·cm or less.

\* \* \* \* \*